(12) United States Patent
Cotlet et al.

(10) Patent No.: US 9,012,770 B2
(45) Date of Patent: Apr. 21, 2015

(54) CONDUCTIVE POLYMER/FULLERENE BLEND THIN FILMS WITH HONEYCOMB FRAMEWORK FOR TRANSPARENT PHOTOVOLTAIC APPLICATION

(75) Inventors: Mircea Cotlet, Rocky Point, NY (US); Hsing-Lin Wang, Los Alamos, NM (US); Hsinhan Tsai, Los Alamos, NM (US); Zhihua Xu, Mineola, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 416 days.

(21) Appl. No.: 13/480,716

(22) Filed: May 25, 2012

(65) Prior Publication Data

US 2013/0014818 A1 Jan. 17, 2013

Related U.S. Application Data

(60) Provisional application No. 61/490,307, filed on May 26, 2011.

(51) Int. Cl.

| | | |
|---|---|---|
| *H01L 31/0236* | (2006.01) | |
| *H01L 51/00* | (2006.01) | |
| *B32B 3/12* | (2006.01) | |
| *B82Y 30/00* | (2011.01) | |
| *H01L 51/42* | (2006.01) | |
| *B82Y 20/00* | (2011.01) | |
| *B82Y 10/00* | (2011.01) | |

(52) U.S. Cl.
CPC ......... *H01L 51/4253* (2013.01); *H01L 51/0036* (2013.01); *H01L 51/0038* (2013.01); *H01L 51/0047* (2013.01); *H01L 51/426* (2013.01); *B82Y 30/00* (2013.01); *Y02E 10/549* (2013.01); *B82Y 20/00* (2013.01); *B82Y 10/00* (2013.01)

(58) Field of Classification Search
USPC ......... 136/236.1, 258, 260, 263, 256; 427/58; 977/842, 735, 734, 740; 428/118; 264/104
See application file for complete search history.

(56) References Cited

FOREIGN PATENT DOCUMENTS

CN 101290973 A * 10/2008

OTHER PUBLICATIONS

Guo et al. CN 101290973 A, English equivalent of the abstract.*
Cotlet, M., et al., "Transparent light-harvesting materials," in: *McGraw-Hill Yearbook of Science & Technology*, 2012, pp. 278-282 with cover page and bibliographic page.
Xu, Z., et al., "Transparent polymer films for capturing solar energy," *SPIE Newsroom*, DOI:10.1117/2.120102.003481, Published Online: Feb. 18, 2011, 2 pages, http://spie.org/x44519.xml?ArticleID=x44519 (last accessed Sep. 16, 2014).
Kippelen, B., et al., "Organic photovoltaics," *Energy & Environmental Science*, vol. 2, pp. 251-261, (2009).
Widawski, G., et al., "Self-organized honeycomb morphology of star-polymer polystyrene films,", Nature, vol. 369, pp. 387-389, (1994).

(Continued)

*Primary Examiner* — Susan D Leong
(74) *Attorney, Agent, or Firm* — Dorene M. Price

(57) ABSTRACT

Optoelectronic devices and thin-film semiconductor compositions and methods for making same are disclosed. The methods provide for the synthesis of the disclosed composition. The thin-film semiconductor compositions disclosed herein have a unique configuration that exhibits efficient photo-induced charge transfer and high transparency to visible light.

52 Claims, 10 Drawing Sheets

(56) References Cited

OTHER PUBLICATIONS

Wang, C., et al., "Synthesis and Characterization of Ethylene Glycol Substituted Poly(phenylene Vinylene) Derivatives," *Applied Materials & Interfaces*, vol. 2, No. 3, pp. 738-747, (2010).

Kim, H., et al., "Organic photovoltaic cells based on conjugated polymer/fullerene composites," *Current Applied Physics*, vol. 1, pp. 139-143, (2001).

Canteenwala, T., et al., "Low Multielectron Reduction Potentials of Emerald Green [60] Fullerenes," *Chemistry Letters*, vol. 35, No. 7, pp. 762-763, (2006).

Tsai, H., et al., "Structural dynamics and charge transfer via complexation with fullerene in large area conjugated polymer honeycomb thin films," *Chemistry of Materials*, vol. 23, pp. 759-761, (2011).

"Increasing energy efficiency through innovation," 2 pages, [online], [retrieved May 29, 2012], From: <URL:http://www.today.ucla.edu/portal/ut/PRN-080207_energy_yang.aspx, [Last accessed Sep. 16, 2014], From: <URL: http://newsroom.ucla.edu/stories/080207_energy_yang >.

* cited by examiner

PRIOR ART

TM-C$_{60}$

EG-C$_{60}$

P1-PPV

P1 dropcast

P1 honeycomb

P1/TM-C$_{60}$ heterojunction

P1/EG-C$_{60}$ blend

FIG. 6c　　　　　　　　FIG. 6d

Fluorescence microscopy image

Bright field microscopy image

CONDUCTIVE POLYMER/FULLERENE BLEND THIN FILMS WITH HONEYCOMB FRAMEWORK FOR TRANSPARENT PHOTOVOLTAIC APPLICATION

CROSS-REFERENCE TO A RELATED APPLICATION

This application claims the benefit under 35 U.S.C. 119(e) of U.S. Provisional Application No. 61/490,307 filed on May 26, 2011, the content of which is incorporated herein in its entirety.

The present invention was made with Government support under contract numbers DE-AC02-98CH10886 and DE-AC52-06NA25396, awarded by the U.S. Department of Energy. The Government has certain rights in the invention.

FIELD OF THE INVENTION

The present invention is directed to optoelectronic devices and transparent thin-film semiconductor compositions and methods for making same. More particularly, the present invention is directed to a thin-film semiconductor composition comprising blended conjugated polymer and an electron acceptor material having a unique configuration that exhibits efficient photo-induced charge transfer and high transparency to visible light.

BACKGROUND

A new generation of optoelectronic devices, such as organic photovoltaics (OPVs), are fabricated using organic semiconductors as their active components. Organic photovoltaic devices are thin film based semiconductor diodes that convert light into electricity by using semiconducting conjugated polymers as active materials capable of harvesting visible light and generating electrons. They do this by absorbing visible photons and creating an excited state known as an exciton (electron-hole pair bound together). Excitons can be broken into electron-hole pairs and separated into charges by appropriate electric fields.

OPVs emerge as one of the most promising technologies in the field of renewable energy, with attractive features, such as the use of low-cost polymeric materials that are light in weight, flexible, and produced by cost-effective processing methods. There are several known types of polymer-based OPVs, such as single layer, double or multi-layer OPVs, and bulk heterojunction OPVs. The best performing OPVs are blended heterojunction OPVs in which a p-type (hole accepting) polymer is blended with an electron accepting material, such as a fullerene, or inorganic nanocrystal (e.g., semiconductor quantum dot, nanorod or tetrapod).

A drawing illustrating the working principle of a prior art OPV based on p-type (donor) and n-type (acceptor) materials is presented in FIG. 1.

Irrespective of their structure, conventional thin-film based OPVs have a polymer layer of a thickness of at least 100 nm to absorb sufficient light to be able to generate electricity. However, this makes them opaque so that it reduces their utilization in technologies where transparency of the film/device is desired.

Transparent OPVs with very thin active material (50 nm or less) in the form of bulk heterojunctions have been realized, with power conversion efficiency as high as 3% and relatively low transparency, i.e., 75% as reported by Solarmer Energy Inc.

As such, there remains a need for transparent thin-film semiconductor compositions based on conductive polymers and electron acceptor material blends that exhibit efficient and effective charge transfer, charge separation and charge transport, and, at the same time, high transparency, for use in the development of, for example, devices utilizing transparent OPVs and the like.

SUMMARY

Transparent thin-film semiconductor compositions are disclosed comprising a p-type conjugated polymer and an electron accepting material, such as a nanomaterial, a fullerene compound, an inorganic nanocrystal, or an n-type conjugated polymer, and to their use in transparent OPVs. The semiconductor composition has a micron-size hexagonal-ring pattern honeycomb structure, with the polymer-based blended material concentrated within the hexagonal-ring frame and with the center of the hexagonal-ring pattern having a thickness that is at least one molecular layer and less than about 10 nm. As such, the thin-film honeycomb framework structure exhibits efficient charge transfer and charge transport and is at the same time highly transparent, at least 75 percent transparent or higher.

According to another embodiment, a method of making a semiconductor composition is disclosed. This method comprises (i) co-dissolving a p-type conjugated polymer and an electron acceptor material (e.g., nanomaterial, fullerene, inorganic nanocrystal, or n-type conjugated polymer) in a non-polar volatile solvent to form a blended solution, (ii) depositing a layer of the blended solution on a hydrophilic solid surface, or on a water layer, and (iii) introducing a high humidity gas over the surface of the blended solution of step (ii), and evaporating the solvent to form a micron-size hexagonal-ring pattern honeycomb polymer-based blended structure with the center of the hexagonal-ring pattern having a thickness that is at least one molecular layer and less than about 10 nm.

According to another embodiment, a transparent photovoltaic device is disclosed including a semiconductor composition comprising a p-type conjugated polymer and an electron acceptor material, such as a fullerene compound or an inorganic nanocrystal, or an n-type conjugated polymer. The semiconductor composition has a micron-size hexagonal-ring pattern honeycomb structure in which the center of the hexagonal-ring pattern has a thickness that is at least one molecular layer and less than about 10 nm.

The disclosed semiconductor composition can be utilized to produce substantially transparent (i.e., 75% and greater) thin-film compositions based on blends of p-type conductive polymers and electron accepting materials, such as, for example, nanomaterials, including fullerenes, inorganic nanocrystals, for example, quantum dots and quantum rods, or n-type conjugated polymers, that when associated exhibit efficient charge transfer, and charge transport. The presently disclosed compositions can be used as active layers for the development of substantially transparent OPVs. One such example is photovoltaic (solar) windows where the device requires thin films that produce electricity, but preserve transparency to visible light, similar to a mesh. Moreover, the disclosed organic or hybrid organic/inorganic semiconductor-based devices may be produced in a cost effective manner.

DETAILED DESCRIPTION

Transparent thin-film semiconductor compositions are disclosed comprising p-type conjugated polymers and electron accepting materials, such as fullerene compounds, or inorganic nanocrystals or n-type conjugated polymers and the application of such thin films in photovoltaic devices.

The p-type and n-type materials are chosen to exhibit efficient charge transfer when in physical contact. Examples of such paired p-type and n-type materials are provided. The transparent thin-film semiconductor compositions have a micron-size hexagonal-ring pattern honeycomb structure, in which the center of the hexagonal-ring pattern has a thickness that is at least one molecular layer and less than about 10 nm. A method is directed to self-assembly of the disclosed compositions to provide the micron-size hexagonal-ring pattern honeycomb structure. The disclosed compositions and methods will become more apparent from the following description and illustrative embodiments which are described in detail with reference to the accompanying drawings.

The disclosed composition has application in the development of photovoltaic devices, such as, for example, transparent organic photovoltaic (OPV) windows.

Figure 3:
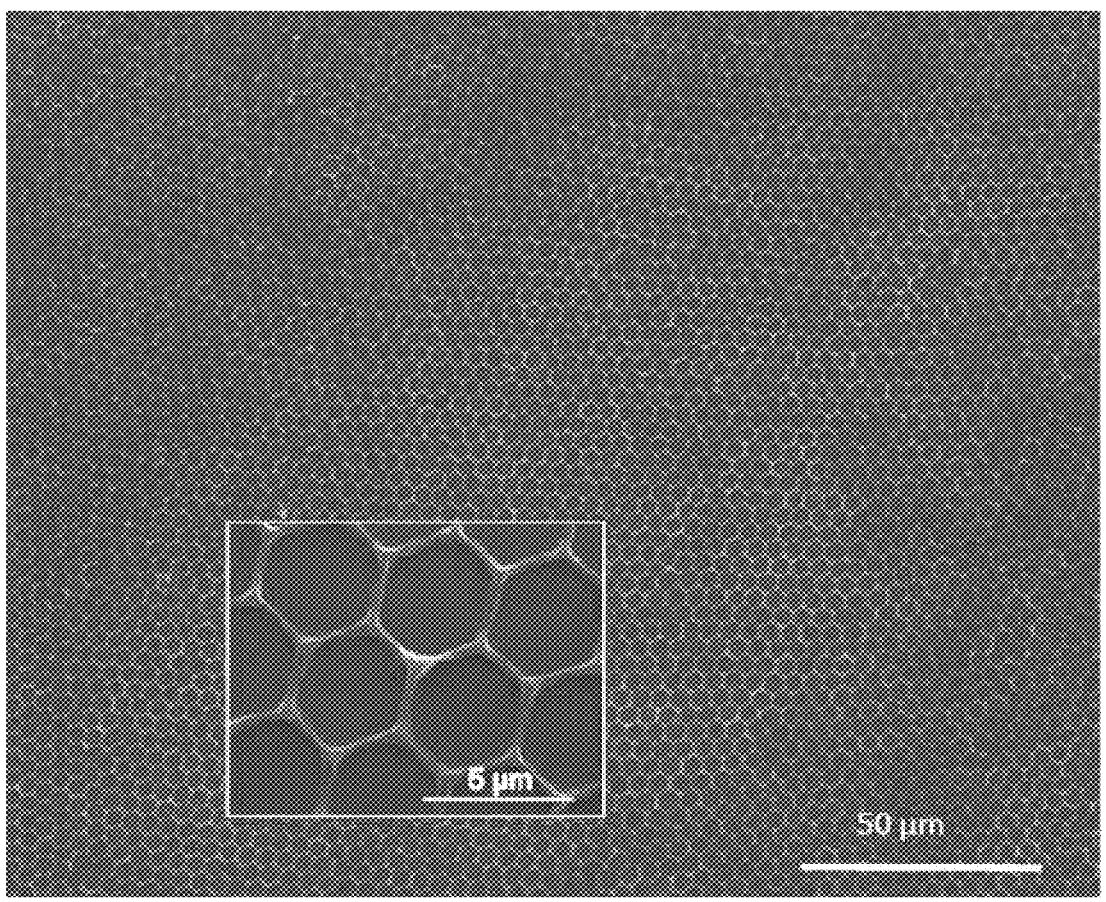
FIG. 3 is a scanning electron microscopy (SEM) image of a P1 PPV polymer having a transparent thin-film with micron-size hexagonal-ring pattern honeycomb structure. Insert is a "zoom" close-up of an area x-y of the scanning electron microscope (SEM) image of FIG. 3.

The disclosed composition comprises a p-type conjugated polymer-based blend that self-assembles into a highly regular pattern of micron-size hexagonal cells having highly transparent centers. The blend is packed into the hexagonal frame structure, see FIG. 3, which presents a scanning electron microscopy picture and a zoom image, respectively, of the hexagonal-ring pattern. FIG. 3 demonstrates the successful large area patterning and highly organized microstructure of the disclosed composition(s).

Figure 4:
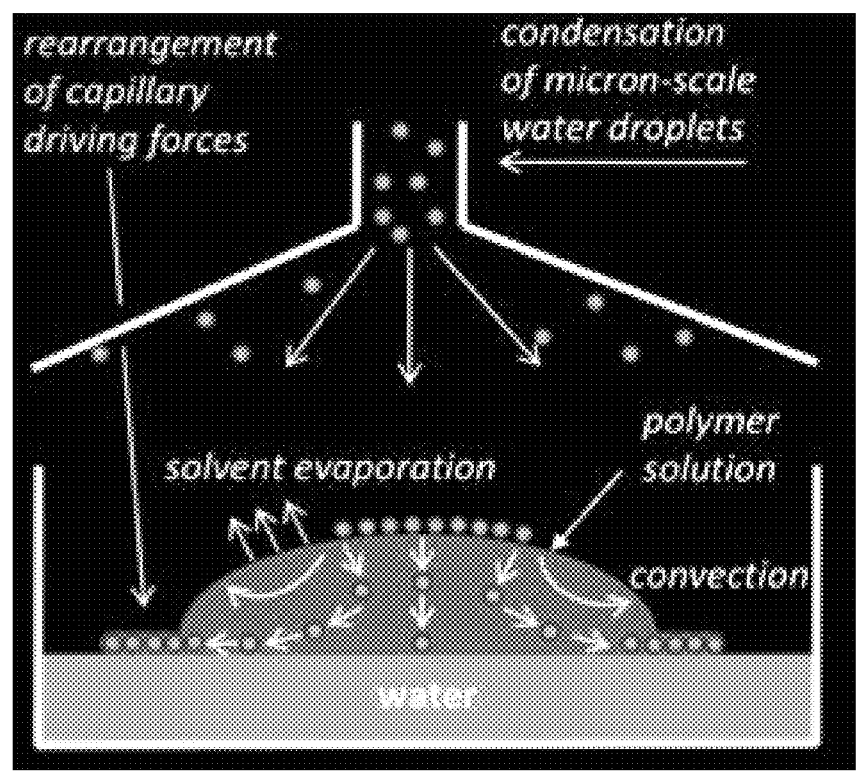
FIG. 4 illustrates the Breath Figure Technique (BFT) used to produce a thin-film polymer/fullerene composition on a water layer that is transferable to a substrate.

The material is self-assembled from a non-polar volatile organic solvent solution containing p-type conjugated polymer and an electron accepting material, such as fullerenes, or inorganic nanocrystals, such as, quantum dots or quantum rods, or an n-type conjugated polymers by utilizing the Breath Figure Technique (BFT), see FIG. 4. The Breath Figure Technique (BFT) has been published in Nature, Widawski et al., 1994, 369, 387 1994, the entire contents of which are incorporated herein by reference. BFT exploits the property of water droplets to condense onto cold surfaces in hexagonal arrays known as breath figures.

The disclosed method advantageously utilizes BFT and the self-assembly of the polymeric blend solution under conditions of controlled humidity, e.g., about 50 to about 99 percent, depending of the type of solvent used, at a temperature range of about 20-25 degrees Celsius, and preferably at about 22 degrees Celsius, and ambient pressure.

Initially, a solution is prepared by co-dissolving the p-type conjugated polymer and an n-type material (i.e., a fullerene compound) in an organic non-polar volatile solvent. A drop of the blended solution is cast on a hydrophilic solid substrate, e.g., silicon pretreated by piranha etch solution, under the aforementioned conditions of controlled humidity, temperature and pressure. If desired, the polymer-based blend solution can be deposited on a layer of water so that the resulting self-assembled thin-film composition can be transferred on other solid substrates. Evaporation of the organic non-polar volatile solvent induces a cooling effect causing a drop in temperature that initiates condensation of the micron size water droplets on the polymer-based blend surface creating breath figures.

After complete evaporation of the non-polar volatile solvent the micron-size hexagonal-ring pattern honeycomb structure is formed.

The conjugated polymers used for fabricating the disclosed transparent thin-film honeycomb structures include those p-type conjugated polymer components, such as, poly(phenylene vinylene) and its derivatives, polyfluorene and its derivatives, and polythiophenes and its derivatives, such as, for example, Poly 3-octyl-thiophene (P3OT), and the like.

The above mentioned p-type conjugated polymers and their n-type counterparts, e.g., electron accepting materials, such as fullerenes, inorganic nanocrystals or n-type conjugated polymers, should be soluble in volatile non-polar solvents and electronically matched to exhibit charge transfer. Methods to prepare such conjugated polymers are known and conventional in the art.

According to one particular embodiment, the polymer used for fabricating transparent thin-film honeycomb structures like those shown in FIGS. 3, 5 (a)-(f), 6 (a)-(d), 7 (a)-(b), 8 (a)-(b) and 9 (a)-(b) is poly{2,5-bis[3-(N,N-diethylamino)-1-oxapropyl]-1,4-phenylenevinylene}, hereafter named P1 PPV. The chemical structure of P1 PPV is shown in FIG. 2(a). The procedure for the chemical synthesis of P1 PPV together with its physico-chemical properties are known in the art and can be found in Wang C. C. et al., *ACS Appl. Mater. Interfaces* 2010, 2, 738, the entire contents of which are incorporated herein by reference.

The overall transparency of the P1 PPV polymer having the disclosed honeycomb thin-film structure, and P1 PPV/EG-$C_{60}$ (emerald green fullerene) blend having the disclosed honeycomb thin-film structure is estimated to be 75 percent or higher. The increased transparency exhibited by the disclosed compositions is provided by the molecular level thickness of the center of the hexagonal-ring pattern of the honeycomb thin film structure. The thickness of the hexagonal-ring's center is provided by one or more molecular level layers of the disclosed composition, which is less than about 10 nm.

The P1 PPV polymer absorbs blue-to-green light (absorption maximum at 460 nm) and emits yellowish-green photoluminescence (emission maximum at around 550 nm). Photoexcited P1 PPV undergoes efficient charge (electron) transfer when complexed with fullerene (emerald green fullerene, EG-$C_{60}$, FIG. 2(b)), when mixed in solvents, for example, chlorobenzene, or chloroform, or when deposited as a dropcast blended thin film from such solvents.

The electron acceptor fullerenes used in the present compositions are well known electron acceptors for p-type conjugated polymers like P1 PPV, so that a combination of two has been proposed (Kim H. et al., *Current Applied Physics* 1, (2-3) 139-143 (2005) using similar but not identical materials (incorporated herein by reference in its entirety)) that would allow photon absorption in the conjugated polymer and photo-induced charge transfer from the conjugated polymer to the fullerene, which can result in collection of the separated charge carriers that form photocurrent.

Figure 1:
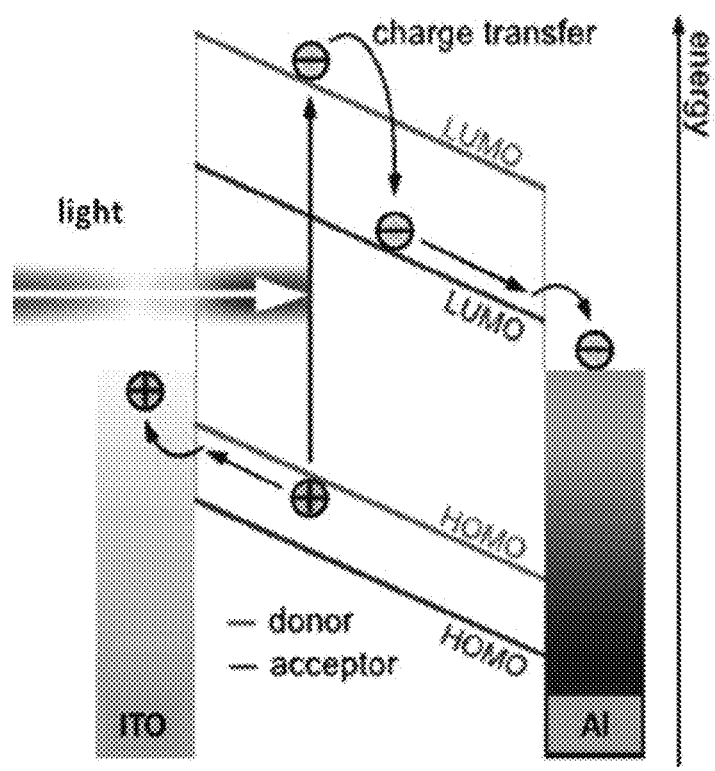
FIG. 1 illustrates the functioning of a prior art organic photovoltaic solar cell based on p-type and n-type organic materials sandwiched between a high work function electrode, i.e., indium-tin oxide (ITO) and a low work function electrode (Al or Au type) (adapted from B. Kippelen et al. RSC Energy Environ. Sci. 2009, 2(3) 241, the entire contents of which are incorporated by reference herein).
Figure 2C:
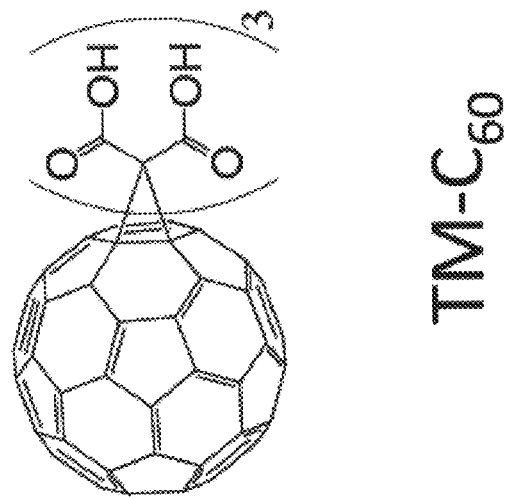
FIG. 2(c) illustrates the chemical structure of a fullerene compound, tris-(malonic-acid) fullerene (TM-$C_{60}$), used to prepare P1 PPV/TM-$C_{60}$ bilayer heterojunction transparent thin films with micron-size hexagonal-ring pattern honeycomb structures.
Figure 2B:
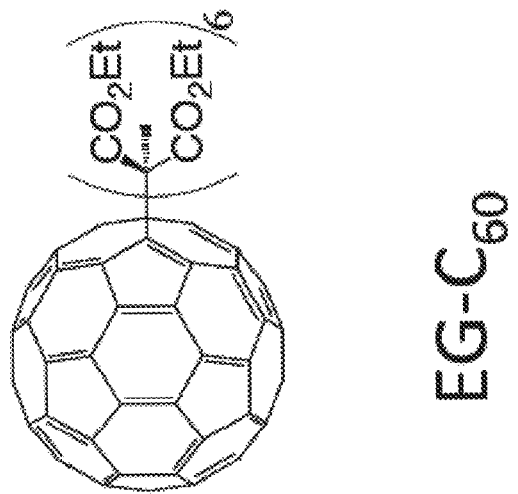
FIG. 2(b) illustrates the chemical structure of a fullerene compound, emerald green fullerene (EG-$C_{60}$), used to prepare a P1 PPV/EG-$C_{60}$ blend to fabricate transparent thin films with micron-size hexagonal-ring pattern honeycomb structures.
Figure 2A:
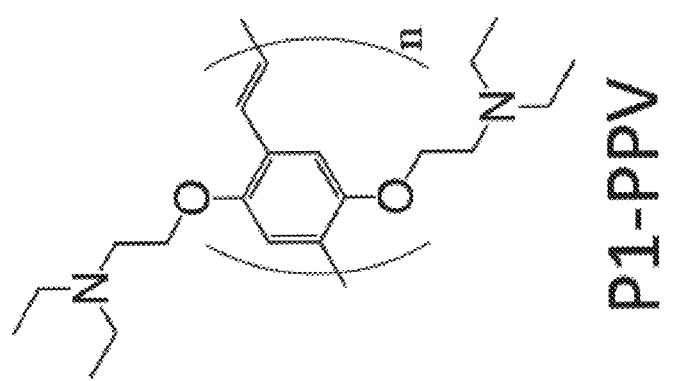
FIG. 2 (a) illustrates the chemical structure of a p-type conjugated polymer, P1 PPV, used to fabricate a polymer/fullerene compound blend.

Particularly useful fullerenes used to prepare the thin-film semiconductor compositions include Buckminsterfullerene ($C_{60}$), such as, for example, emerald green fullerenes, (i.e., EG-$C_{60}$), $C_{60}[C(CH_3)(CO_2Et)_2]_6$ (see FIG. 2(b)). The emerald green fullerenes can be prepared by means known in the art, for example, as detailed in T. Canteenwala et al. *Chemistry Letters*, 2006, 35(7), 762 (incorporated herein by reference in its entirety).

Other useful electron acceptor materials that can be used in the preparation of the thin-film semiconductor composition disclosed herein may include any small molecule that can accept electrons, as well as inorganic nanocrystals, such as quantum dots and quantum rods, as well as n-type conjugated polymers.

The presently disclosed method for preparing the thin-film semiconductor compositions having micron-size hexagonal-ring pattern honeycomb structures is schematically presented in FIG. 4. It relies on the Breath Figure Technique, wherein micron size water droplets condense onto cold surfaces (via solvent evaporation) in hexagonal arrays known as breath figures. According to one particular embodiment, the disclosed method includes co-dissolving the p-type P1 PPV conjugated polymer and electron acceptor material EG-$C_{60}$ fullerene in a molar ratio of about 4:1 to about 6:1 and at concentrations of about 4 mg of the polymer per milliliter of solvent.

Suitable non-polar volatile solvents that can be use in the present method include any non polar volatile solvent, such as, for example, chlorobenzene, chloroform or carbon disulfide.

After co-dissolving conjugated polymer and fullerene, a drop (5-15 µL) of the co-dissolved P1 PPV and EG-$C_{60}$ blended solution is cast on a solid but hydrophylic substrate, for example, a cover glass, under conditions of controlled humidity. A constant flow of moist air or nitrogen is purged on top of the codissolved solution. After complete evaporation of the solvent, a highly regular honeycomb polymer/fullerene structure having a micron-size hexagonal-ring pattern is formed.

Frameworks with areas as large as 1 mm$^2$ can be achieved utilizing the blend of P1 PPV and EG-$C_{60}$, or P1 PPV polymer alone. The deposition method can be realized entirely on a thin layer of water that facilitates convenient removal, i.e., peel off, and transfer of the thin-film honeycomb structure onto other solid supports and fabrication of devices, such as, for example, a photovoltaic device.

According to another embodiment, a combination of poly (3-hexylthiophene) (P3HT) and [6,6]-phenyl-$C_{61}$-butyric acid methyl ester (PCBM) co-dissolved in chlorobenzene can be used to develop similar thin-film honeycomb structures.

EXAMPLES OF COMPOSITIONS FOR USE IN PHOTOVOLTAIC DEVICES

Example 1

Preparation of thin-film P1 PPV composition (for use as single layer OPV) having micron-size hexagonal-ring pattern honeycomb structures was initiated by employing P1 PPV (prepared by conventional methods) dissolved in an organic non-polar volatile solvent, such as chlorobenzene at a concentration of about 4 mg/ml, with mechanical stirring and heating below the boiling point of the solvent to prepare a solution. The resulting solution was filtered through a syringe filter to remove suspension particles.

The micron-size hexagonal-ring pattern honeycomb structures were prepared first by dropping 5 µL of the prepared P1 PPV solution on top of a water surface, the P1 PPV solution immediately spread to form a wet solution layer. Subsequently, water vapor was introduced under conditions of controlled high humidity, by passing nitrogen gas through a volumetric flask filled with deionized water. The nitrogen gas flow carrying water vapor was blown on top of the P1 PPV layer, resulting in condensed water droplets which self-assembled into breath figures. After solvent evaporation, a single layer honeycomb structure film characterized by micron-size hexagonal-ring pattern was formed and remained on the top of the pure water surface. The honeycomb thin film was transferred to a glass slide for further characterization.

Example 2

Preparation of thin-film P1 PPV conjugated polymer and Tris-(malonic-acid) fullerene (i.e., TM-$C_{60}$) composition (i.e., P1 PPV/TM-$C_{60}$) (for use as bilayer or planar heterojunction OPV and as a comparative example for the polymer/fullerene blend thin-film honeycomb structure described in Example (3) having micron-size hexagonal-ring pattern honeycomb structure was initiated by immersing the P1 PPV thin-film honeycomb structure prepared in Example (1) on a cover glass support into a 5 ml TM-$C_{60}$ solution (1 mg/ml in methanol solution) for approximately 5 minutes. The honeycomb thin film was then removed from the TM-$C_{60}$ solution and twice washed with methanol, followed by drying with argon gas.

Example 3

Preparation of thin-film blended P1 PPV conjugated polymer and EG-$C_{60}$ fullerene compound (for use as blended bulk heterojunction OPV) having micron-size hexagonal-ring pattern honeycomb structure, was initiated by separately dissolving 4.0 mg P1-PPV and 1.0 mg EG-$C_{60}$ each in 1.0 ml of chlorobenzene. The resulting solutions were mixed and sonicated to provide a "blend" of P1 PPV and EG-$C_{60}$. 5 μl of the blended solution was filtered through a syringe filter and used for film fabrication as described in Example (1) for P1. PPV composition.

The EG-$C_{60}$ fullerene compound of Example (3) can be substituted using an inorganic nanocrystal, or an n-type conjugated polymer to prepared the thin-film composition having a micron-size hexagonal-ring pattern honeycomb structure.

Example 4

Figure 6A:
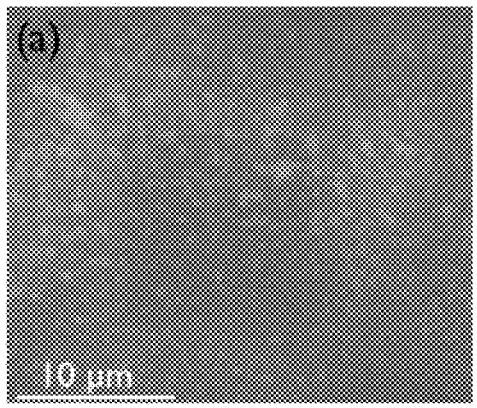
FIGS. 6 (a)-(d) are SEM images of thin films of (a) drop-cast P1 PPV polymer, (b) P1 PPV polymer having the transparent thin-film with micron-size hexagonal-ring pattern honeycomb structure, (c) bilayer heterojunction P1 PPV/TM-$C_{60}$, having the transparent thin-film with micron-size hexagonal-ring pattern honeycomb structure, and (d) blended P1 PPV/EG-$C_{60}$ having the transparent thin-film with micron-size hexagonal-ring pattern honeycomb structure. The drop-cast P1 PPV polymer means no precipitation using breath figure technique.
Figure 6B:
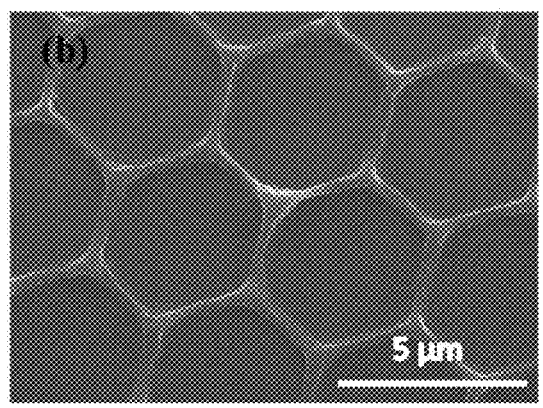
Figure 6B:
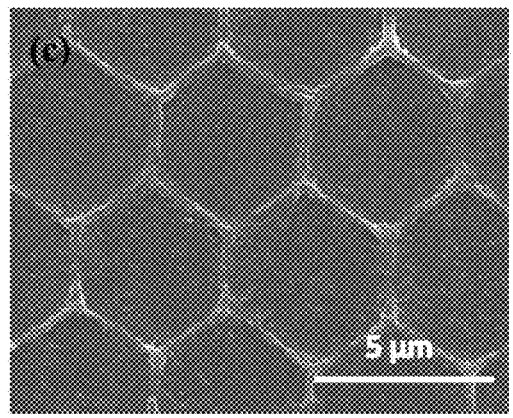
Figure 6B:
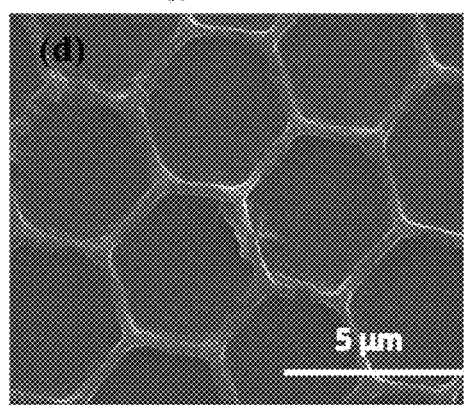

A P1 PPV thin-film dropcast from chlorobenzene on a coverglass in conditions of normal laboratory humidity (40% humidity) in open air and without the use of the BFT was used for comparative purposes. This thin film did not show a honeycomb structure, as illustrated in FIG. 6(a).

Figure 5C:
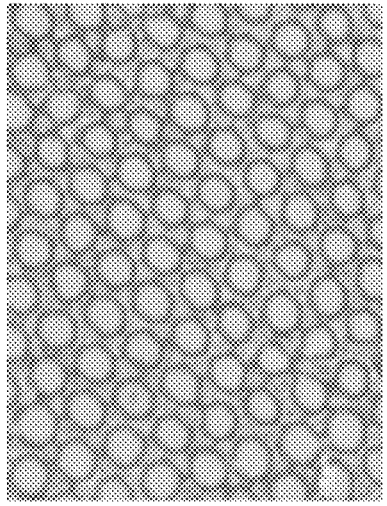
FIGS. 5 (a)-(f) are optical transmission (bright field) images reflecting the concentration dependent morphology of the disclosed compositions, P1 PPV polymer having a transparent thin-film with micron-size hexagonal-ring pattern honeycomb structure, prepared from high concentration (a, b, c), to optimal concentration (d), and to low concentration (e, f).
Figure 5F:
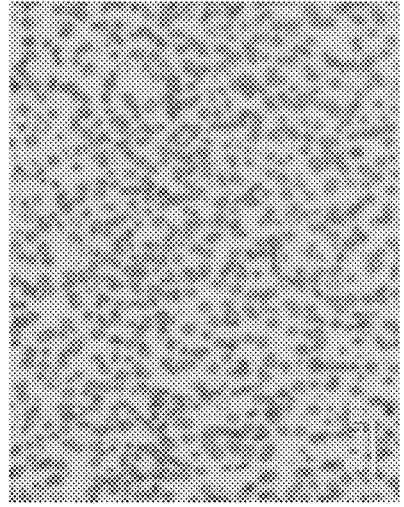
Figure 5B:
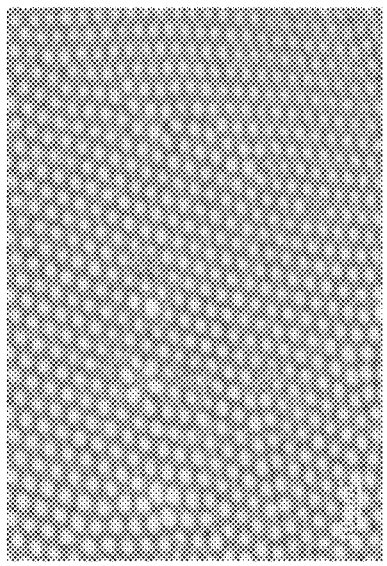
Figure 5E:
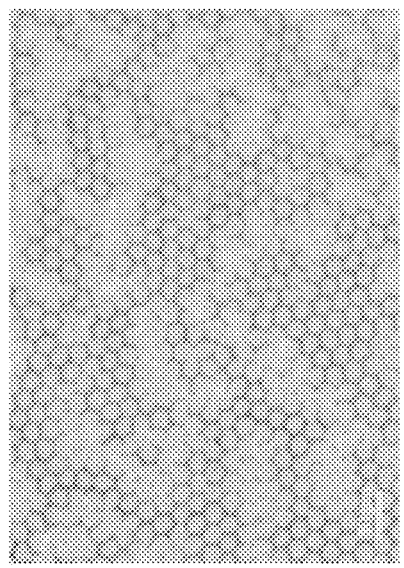
Figure 5A:
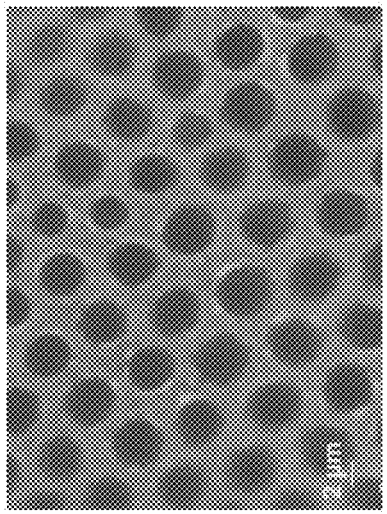
Figure 5D:
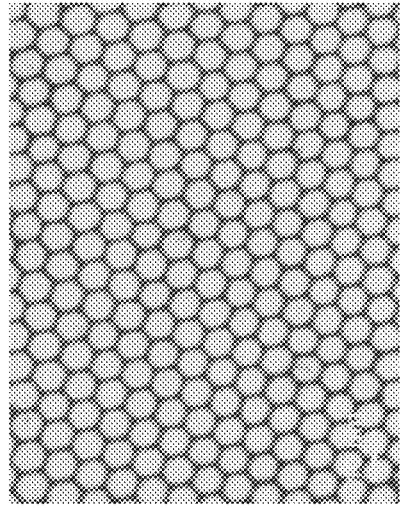

The morphology of the thin-film micron-size hexagonal-ring pattern honeycomb structures are concentration dependent. In this regard, according to a specific embodiment of the invention, a concentration of about 4 mg/mL of P1 PPV polymer in chlorobenzene provides a highly uniform micron-size hexagonal-ring pattern of the honeycomb structure as illustrated in FIG. 5(d).

FIGS. 5(a)-(f) present the concentration-dependent morphology of the described P1-PPV polymer having transparent thin-film with micron-size hexagonal-ring pattern honeycomb structure of Example (1), as demonstrated by brightfield transmission micrograph images. While higher concentration, e.g., greater than about 6 mg of polymer per milliliter of non-polar volatile solvent, results in a thick film with rounded holes, see FIGS. 5(a),(b), and (c). Lower concentrations, e.g., less than about 2 mg of polymer per milliliter of non-polar volatile solvent, gives rise to defects in the honeycomb pattern and eventually unconnected individual ring structures, see FIGS. 5(e), and (f). Optimal concentrations range from about 2 mg to 6 mg of polymer per milliliter of solvent, and more particularly, about 4 mg of polymer per milliliter nonpolar volatile solvent, as seen in the ring structure presented in FIG. 5(d).

For honeycomb films with P1 PPV optimal concentration, defects in the form of pentagons and heptagons were observed and they represent less than about one (1) percent of the structure.

Structural and optical characterization by scanning electron microscopy images of concentration optimized thin-film micron-size hexagonal-ring pattern honeycomb structures consisting of the above-described examples of either polymer of Example (1), or the polymer/fullerene bilayer of Example (2), and the polymer/fullerene blend of Example (3), reveal highly regular, honeycomb framework over large area and with perfect hexagonal rings of 3-4 micron size. FIG. 3 presents such an image in addition to the corresponding zoom image, of a large area patterned thin-film honeycomb structure of the P1 PPV polymer of Example (1).

FIGS. 6(a)-(d) are high resolution scanning electron microscopy images of thin films of dropcast P1 PPV polymer of Example (4), of the P1 PPV polymer composition of Example (1) having micron-size hexagonal-ring pattern honeycomb structure, P1 PPV/TM-$C_{50}$ composition of Example (2) having micron-size hexagonal-ring pattern honeycomb structure, and the blended P1 PPV/EG-$C_{60}$ composition of Example (3), respectively. As presented in FIGS. 6(b) and (c), they demonstrate substantially perfect hexagonal-ring structures achieved with the BFT method.

Figure 10A:
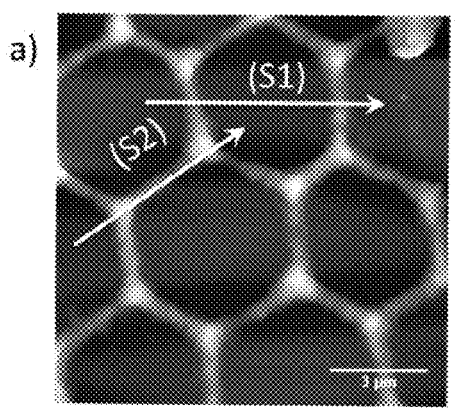
FIGS. 10(a) and 10(b) are (a) an atomic force microscopy image and (b) a three-dimensional reconstruction, respectively, of a P1 PPV polymer thin-film honeycomb structure.
Figure 10B:
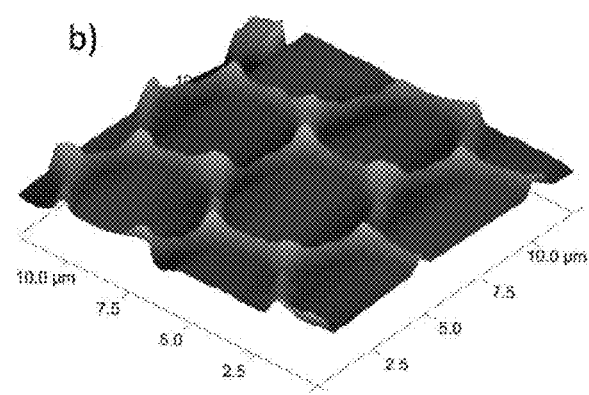
Figure 10C:
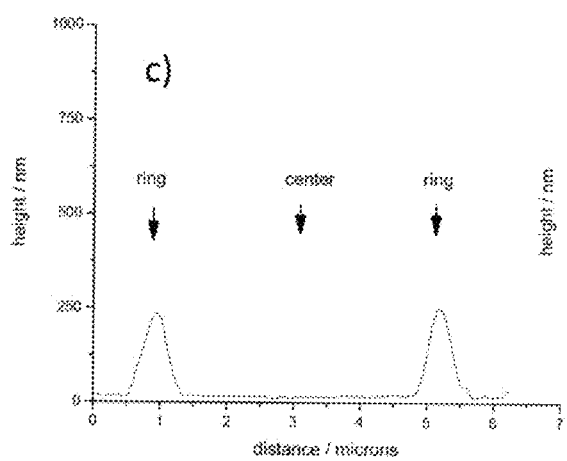
FIGS. 10(c) and 10(d) are graphs showing line profile sections of the hexagon-ring patterns from FIGS. 10(a) and 10(b) through the center of the ring (S1 arrow) and through the frame (S2 arrow), respectively.
Figure 10D:
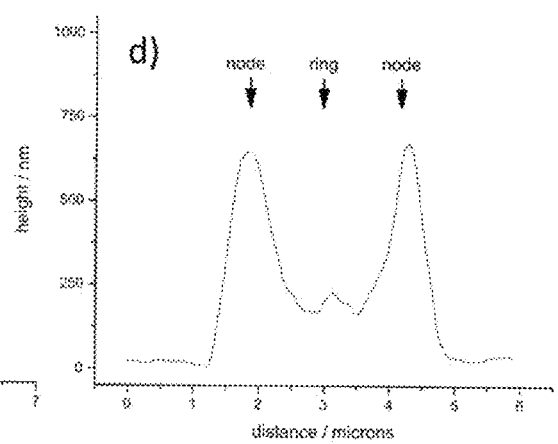

Morphological characterization of Example 1 by atomic force microscopy is depicted in FIGS. 10(a) and (b), and identifies hexagonal cells with an average node and frame thicknesses of 600 nm and 250 nm, respectively, demonstrating that most of the polymer is concentrated in the hexagonal ring frame and very little at the center of the hexagonal ring frame. FIGS. 10(c) and (d) graphically illustrate line profile sections of the hexagon through the center of the ring, which is represented by the S1 arrow and through the frame, as represented by the S2 arrow, respectively, in FIG. 10(a). FIG. 10(b) presents a three-dimensional reconstruction of image shown in FIG. 10(a), i.e., the P1 PPV polymer of Example (1), thin-film honeycomb structure.

The compositions of Examples (1), (2) and (3) are highly transparent at the center of the hexagon rings when observed with optical transmission microscopy. Such transparent regions can be seen as "shadowed regions" in FIG. 7(a). The thin-film P1 PPV polymer of Example (1) having the honeycomb structure is highly fluorescent (photoluminescent) when exposed to blue light, especially at the node/frame of the hexagon rings, see FIG. 7(b) and FIG. 8(a). In addition, the blended P1 PPV/EG-$C_{60}$ composition honeycomb structure exhibits severely quenched photoluminescence due to efficient charge transfer, as can be seen by comparing FIG. 8(b), confocal fluorescence lifetime image of P1 PPV polymer of Example (1) having thin-film honeycomb structure, with FIG. 9(a), confocal fluorescence lifetime image of P1 PPV/TM-$C_{60}$ bilayer heterojunction honeycomb structure, and with FIG. 9(b), confocal fluorescence lifetime image of P1 PPV/EG-$C_{60}$ blend honeycomb structure and related confocal fluorescence lifetime decays from FIGS. 8(c) and 9(c).

Figure 7B:
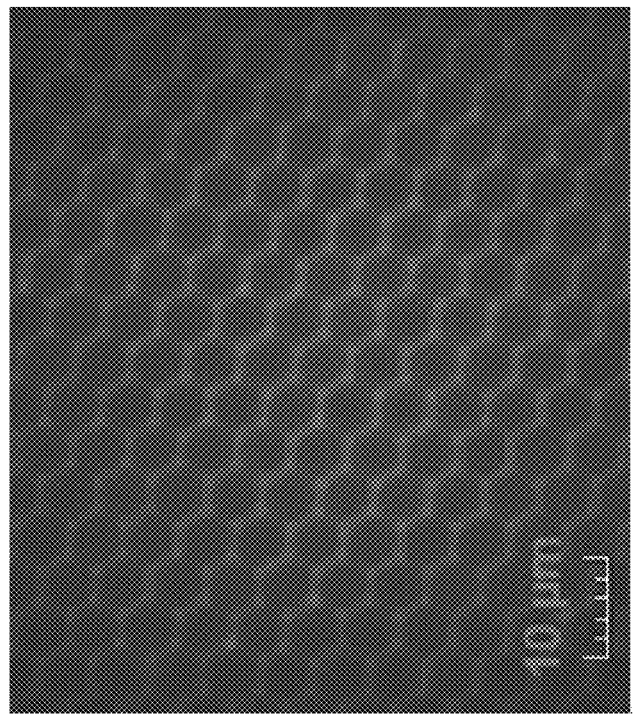
FIGS. 7(a)-(b) are bright-field transmission and fluorescence micrographs, respectively, from an area of the P1 PPV polymer having the transparent thin-film with micron-size hexagonal-ring pattern honeycomb structure.
Figure 7A:
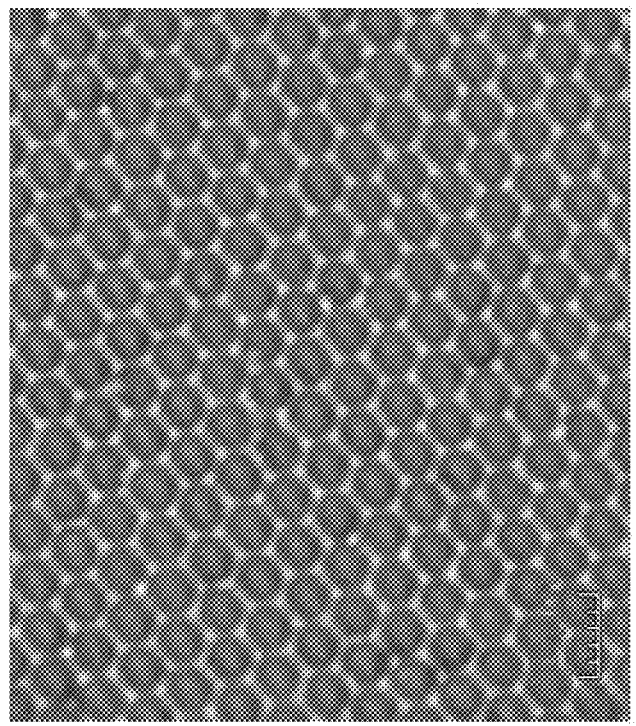
Figure 8A:
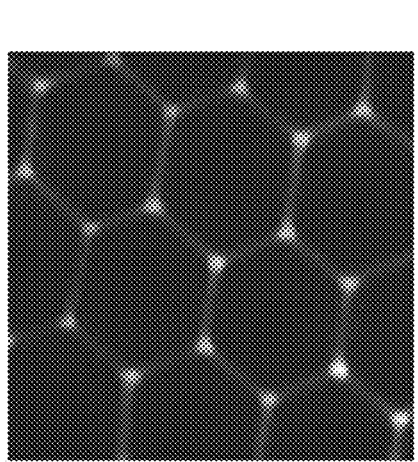
FIGS. 8(a) and 8(b) are confocal fluorescence intensity and confocal fluorescence lifetime images, respectively, of an area of a P1 PPV polymer thin-film honeycomb structure.
Figure 8B:
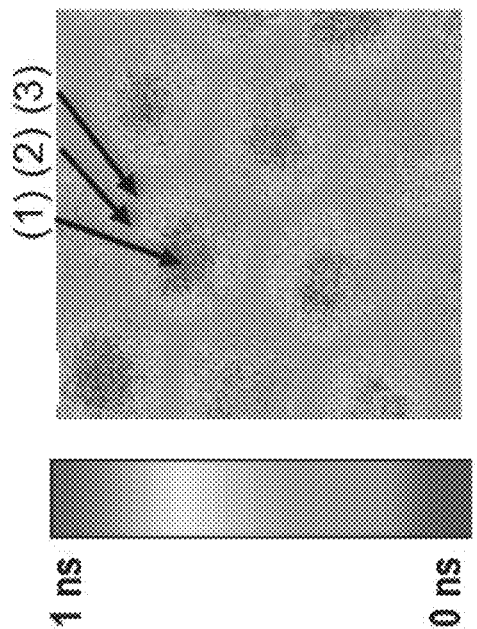
Figure 8C:
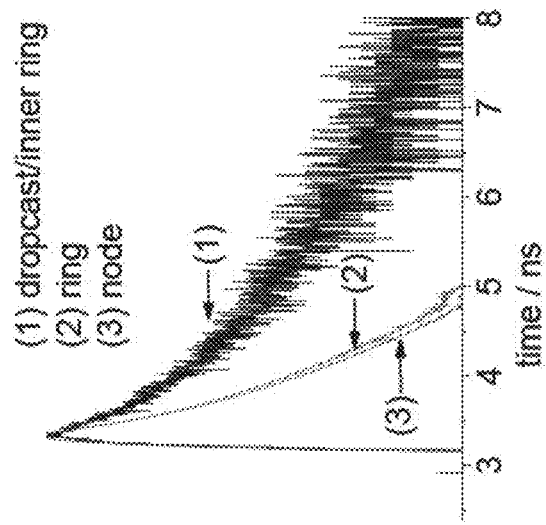
FIG. 8(c) is a graph illustrating the confocal fluorescence lifetime decays measured as indicated in FIG. 8(b), at the center of the hexagonal-ring pattern (1), and at the hexagonal-ring pattern, specifically at the node (curve (2)), and frame (curve (3)).

For the P1 PPV composition of Example (1), intense photoluminescence signals are detected only from the hexagonal framework and in particular from the intersection points (nodes) of the framework, see FIG. 7(b) and FIG. 8(a). These regions feature short photoluminescence lifetimes, on the average of 0.43 ns, see FIGS. 8(b) and 8(c). Photoluminescence spectra from such local regions (frame, either node or ring but not the center/inner region) are structured and red shifted when compared to similar spectra of P1 PPV in chlorobenzene solution and of P1 PPV dropcast film, which are broad and featureless. The inner region of the hexagonal rings of P1 PPV polymer composition of Example (1) with honeycomb structure exhibits long photoluminescence lifetimes, on the average 1.5 ns, similar to those observed for P1 PPV dropcast films. The above experimental observations conclude that the center of the micron-size hexagonal-ring pattern of the honeycomb structure is an extremely thin (mono) layer of P1 PPV polymer film and that P1 PPV polymer material in the case of P1 PPV polymer honeycomb structure of Example (1) is strongly packed with extended polymer chains favoring increased charge mobility when charge transfer is present, for example in the case of polymer/fullerene blend honeycomb structure of Example (3).

Figure 9:
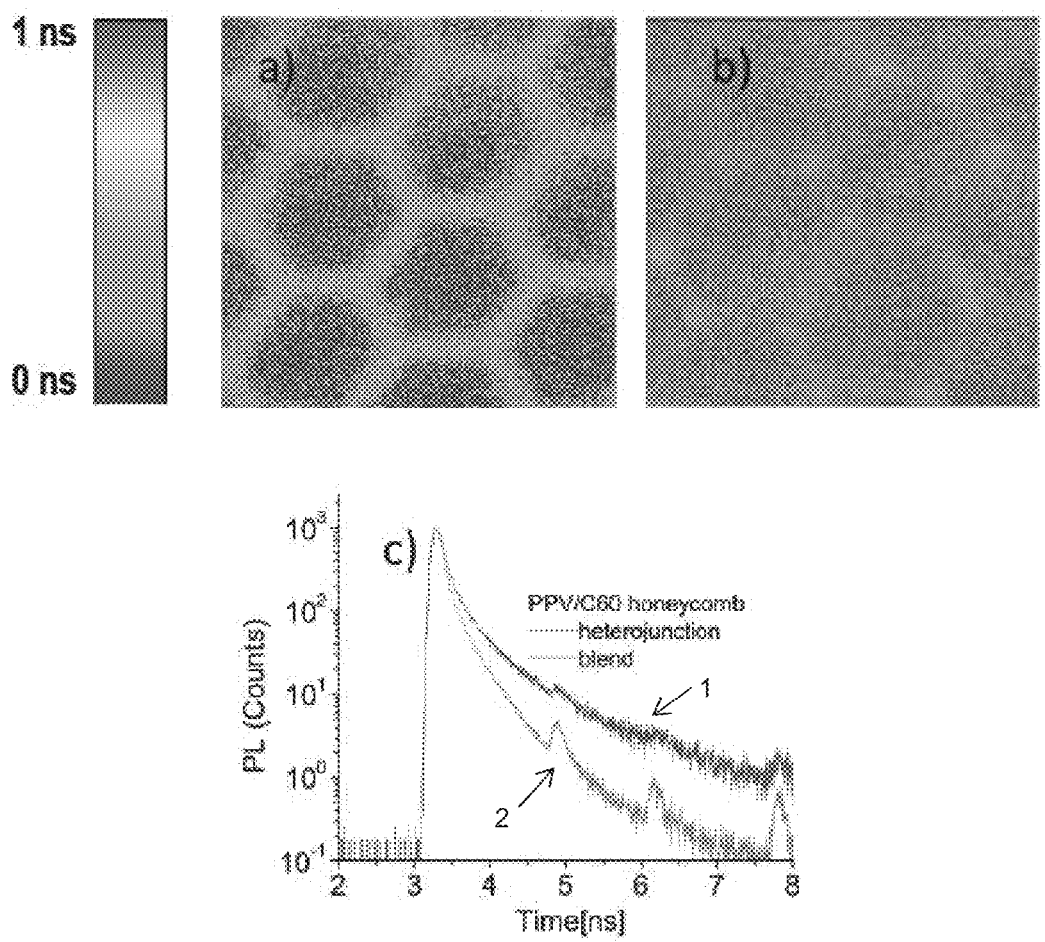
FIGS. 9(a) and 9(b) are confocal fluorescence lifetime images of (a) a P1 PPV/TM-$C_{60}$ bilayer heterojunction transparent honeycomb structure and (b) a P1 PPV/EG-$C_{60}$ blended transparent honeycomb structure, respectively.
FIG. 9(c) is a graph illustrating the confocal fluorescence lifetime decays measured from the hexagonal-ring pattern for the P1 PPV/TM-$C_{60}$ bilayer heterojunction composition (1) and P1 PPV/EG-$C_{60}$ blend composition (2), respectively, demonstrating enhanced quenching by charge transfer in the case of the polymer/fullerene blend composition (2).

A comparison of the confocal fluorescence lifetime images for the P1 PPV/TM-$C_{60}$ bilayer heterojunction honeycomb structure of Example (2), FIG. 9(a); for the P1 PPV/EG-$C_{60}$ blend honeycomb structure of Example (3), FIG. 9(b); and for the associated confocal fluorescence lifetime decays from the graph of FIG. 9(c) demonstrates enhanced quenching in the case of blend structure of Example (3).

These results demonstrate the efficient charge transfer within the whole honeycomb when using the blended P1 PPV/EG-$C_{60}$ heterojunction composition. Further, the blended P1 PPV/EG-$C_{60}$ heterojunction composition exhibits efficient photoinduced charge transfer while preserving high transparency to visible light. Furthermore, the method of fabricating the disclosed thin-film semiconductor compositions and photovoltaic devices is cost effective and scalable to large areas. As such, the disclosed thin-film semiconductor composition can be used as an active layer in organic photovoltaic devices that require the preservation of transparency to visible light.

It will be appreciated by persons skilled in the art that the present disclosure is not limited to what has been particularly shown and described. Rather, the scope of the present invention is defined by the claims which follow. It should further be understood that the above description is only representative of illustrative examples of embodiments. For the reader's convenience, the above description has focused on a representative sample of possible embodiments, a sample that teaches the principles of the present invention. Other embodiments may result from a different combination of portions of different embodiments.

The description has not attempted to exhaustively enumerate all possible variations. That alternate embodiments may not have been presented for a specific portion of the invention, and may result from a different combination of described portions, or that other undescribed alternate embodiments may be available for a portion, is not, to be considered a disclaimer of those alternate embodiments. It will be appreciated that many of those undescribed embodiments are within the literal scope of the following claims, and others are equivalent. Furthermore, all references, publications, U.S. patents, and U.S. patent application Publications cited throughout this specification are hereby incorporated by reference as if fully set forth in this specification.

The invention claimed is:

1. A thin-film semiconductor composition comprising a blend of conjugated polymer and an electron acceptor material, the semiconductor composition having a micron-size hexagonal-ring pattern honeycomb structure, wherein the center of the hexagonal-ring pattern has a thickness that is at least one molecular layer and less than about 10 nm.

2. The semiconductor composition of claim 1, wherein the conjugated polymer is a p-type conjugated polymer.

3. The semiconductor composition of claim 2, wherein the p-type conjugated polymer is a polymer selected from the group consisting of polyphenylene vinylene (PPV) compounds, polythiophene compounds, and polyfluorene compounds.

4. The semiconductor composition of claim 1, wherein the conjugated polymer is poly(3-hexylthiophene) (P3HT).

5. The semiconductor composition of claim 1, wherein the conjugated polymer is Poly 3-octyl-thiophene (P3OT).

6. The semiconductor composition of claim 1, wherein the conjugated polymer is poly{2,5-bis[3-(N, N-diethylamino)-1-oxapropyl]-1,4-phenylenevinylene}.

7. The semiconductor composition of claim 1, wherein the electron acceptor material is selected from the group consisting of fullerene compounds, n-type conjugated polymers, and inorganic nanocrystals.

8. The semiconductor composition of claim 1, wherein the electron acceptor material is a buckminsterfullerene ($C_{60}$).

9. The semiconductor composition of claim 1, wherein the electron acceptor material is an emerald green fullerene compound.

10. The semiconductor composition of claim 1, wherein the electron acceptor material is $C_{60}[C(CH_3)(CO_2Et)_2]_6$.

11. The semiconductor composition of claim 1, wherein the electron acceptor material is [6,6]-phenyl-$C_{61}$-butyric acid methyl ester (PCBM).

12. The semiconductor composition of claim 7, wherein the inorganic nanocrystal is a semiconducting quantum dot having a core of the type CdS, CdSe, CdTe, PbS, or PbSe.

13. The semiconductor composition of claim 7, wherein the inorganic nanocrystal is a semiconducting quantum rod of the type CdS, CdSe, CdTe, PbS or PbSe.

14. The semiconductor composition of claim 1, wherein said composition is substantially transparent to visible light.

15. A method of making a thin-film semiconductor composition, the method comprising:
  i) co-dissolving a conjugated polymer and an electron acceptor material in a non-polar volatile solvent to form a blended solution;
  ii) depositing a layer of the blended solution of (i) on a hydrophilic solid surface, or a water layer;
  iii) introducing a high humidity gas over the surface of the blended solution of (ii); and
  iv) evaporating the solvent of (i) to provide a micron-size hexagonal-ring pattern honeycomb polymer-based blended structure, wherein the center of the hexagonal-ring pattern has a thickness that is at least one molecular layer and less than about 10 nm.

16. The method of claim 15, wherein the conjugated polymer is a p-type conjugated polymer.

17. The method of claim 16, wherein the p-type conjugated polymer is a polymer selected from the group consisting of polyphenylene vinylene (PPV) compounds, polythiophene compounds, and polyfluorene compounds.

18. The method of claim 15, wherein the conjugated polymer is poly{2,5-bis[3-(N, N-diethylamino)-1-oxapropyl]-1,4-phenylenevinylene}.

19. The method of claim 15, wherein the conjugated polymer is poly(3-hexylthiophene) (P3HT).

20. The method of claim 15, wherein the conjugated polymer is Poly 3-octyl-thiophene (P3OT).

21. The method of claim 15, wherein the electron acceptor material is at least one selected from the group consisting of fullerene compounds, inorganic nanocrystals, and n-type conjugated polymers.

22. The method of claim 15, wherein the electron acceptor material is a buckminsterfullerene ($C_{60}$).

23. The method of claim 15, wherein the electron acceptor material is an emerald green fullerene compound.

24. The method of claim 15, wherein the electron acceptor material is $C_{60}[C(CH_3)(CO_2Et)_2]_6$.

25. The method of claim 15, wherein the electron acceptor material is [6,6]-phenyl-$C_{61}$-butyric acid methyl ester (PCBM).

26. The method of claim 21, wherein the inorganic nanocrystal is a semiconducting quantum dot having a core of the type CdS, CdSe, CdTe, PbS, or PbSe.

27. The method of claim 21, wherein the inorganic nanocrystal is a semiconducting quantum rod of the type CdS, CdSe, CdTe, PbS, or PbSe.

28. The method of claim 15, wherein said composition is substantially transparent to visible light.

29. The method of claim 15, wherein the high humidity gas is about 55 percent to about 99 percent water, at a temperature of about 20 to about 25 degrees Celsius, and at an ambient pressure.

30. A photovoltaic device comprising a thin-film semiconductor composition comprising a conjugated polymer and an electron acceptor material, the semiconductor composition having a micron-size hexagonal-ring pattern honeycomb structure, wherein the center of said hexagonal-ring pattern has a thickness that is at least one molecular layer and less than about 10 nm.

31. The photovoltaic device of claim 30, wherein the conjugated polymer is a p-type conjugated polymer.

32. The photovoltaic device of claim 31, wherein the p-type conjugated polymer is at least one polymer selected from the group consisting of polyphenylene vinylene (PPV) compounds, polythiophene compounds, and polyfluorene compounds.

33. The photovoltaic device of claim 30, wherein the conjugated polymer is poly{2,5-bis[3-(N, N-diethylamino)-1-oxapropyl]-1,4-phenylenevinylene}.

34. The photovoltaic device of claim 30, wherein the conjugated polymer is poly(3-hexylthiophene) (P3HT).

35. The photovoltaic device of claim 30, wherein the conjugated polymer is Poly 3-octyl-thiophene (P3OT).

36. The photovoltaic device of claim 30, wherein the electron acceptor material is an emerald green fullerene compound.

37. The photovoltaic device of claim 30, wherein the electron acceptor material is $C_{60}[C(CH_3)(CO_2Et)_2]_6$.

38. The photovoltaic device of claim 30, wherein the electron acceptor material is [6,6]-phenyl-$C_{61}$-butyric acid methyl ester (PCBM).

39. The photovoltaic device of claim 30, wherein the thin-film semiconductor composition is substantially transparent to visible light.

40. The photovoltaic device of claim 30, wherein the electron acceptor material is selected from the group consisting of a fullerene compound, an inorganic nanocrystal, and an n-type conjugated polymer.

41. The photovoltaic device of claim 40, wherein the inorganic nanocrystal is a semiconducting quantum dot having a core of the type CdS, CdSe, CdTe, PbS, or PbSe.

42. The photovoltaic device of claim 40, wherein the inorganic nanocrystal is a semiconducting quantum rod of the type CdS, CdSe, CdTe, PbS, or PbSe.

43. An article of manufacturing comprising the composition of claim 1.

44. The article of manufacture of claim 43, wherein the article of manufacture is an electronic device, an optical device, or an optoelectronic device.

45. A composite comprising a substrate and the thin-film semiconductor composition of claim 1 deposited on the substrate.

46. A field effect transistor device comprising the thin-film semiconductor composition of claim 1.

47. The method of claim 15, wherein the thin-film semiconductor composition is synthesized on a solid substrate.

48. The method of claim 15, wherein the thin-film semiconductor composition is synthesized on a hydrophilic solid substrate.

49. The method of claim 15, wherein the semiconductor composition is synthesized on a layer of water.

50. The semiconductor composition of claim 1, wherein said composition is at least 75 percent transparent to visible light.

51. The method of claim 15, wherein said thin-film semiconductor composition is at least 75 percent transparent to visible light.

52. The photovoltaic device of claim 30, wherein the thin-film semiconductor composition is at least 75 percent transparent to visible light.

* * * * *

UNITED STATES PATENT AND TRADEMARK OFFICE
CERTIFICATE OF CORRECTION

PATENT NO. : 9,012,770 B2
APPLICATION NO. : 13/480716
DATED : April 21, 2015
INVENTOR(S) : Mircea Cotlet et al.

It is certified that error appears in the above-identified patent and that said Letters Patent is hereby corrected as shown below:

On the title page item (73),

ASSIGNEES should read:

Brookhaven Science Associates, LLC
Los Alamos National Security, LLC

Signed and Sealed this
Fourteenth Day of June, 2016

Michelle K. Lee
*Director of the United States Patent and Trademark Office*